United States Patent
An

(10) Patent No.: US 9,018,837 B2
(45) Date of Patent: Apr. 28, 2015

(54) DISPLAY DEVICE

(71) Applicant: Samsung Display Co., Ltd., Yongin, Gyeonggi-Do (KR)

(72) Inventor: Ju-Bong An, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/030,922

(22) Filed: Sep. 18, 2013

(65) Prior Publication Data

US 2014/0346946 A1   Nov. 27, 2014

(30) Foreign Application Priority Data

May 27, 2013   (KR) .................. 10-2013-0059796

(51) Int. Cl.
  *H01J 1/62*  (2006.01)
  *H01J 63/04*  (2006.01)
  *H05B 33/22*  (2006.01)

(52) U.S. Cl.
  CPC ..................................... *H05B 33/22* (2013.01)

(58) Field of Classification Search
  CPC ........................................................ H05B 33/22
  USPC ......... 313/511, 512, 504, 495, 496, 497, 582, 313/583, 584, 586, 587, 585; 445/24, 25
  See application file for complete search history.

(56) References Cited

U.S. PATENT DOCUMENTS

| | | | |
|---|---|---|---|
| 2003/0002126 A1* | 1/2003 | Doron | 359/242 |
| 2005/0127371 A1* | 6/2005 | Yamazaki et al. | 257/72 |
| 2006/0132027 A1* | 6/2006 | Gao | 313/506 |
| 2006/0132030 A1* | 6/2006 | Gao et al. | 313/511 |
| 2008/0122358 A1* | 5/2008 | Kwon et al. | 313/583 |
| 2009/0073370 A1* | 3/2009 | Kondo et al. | 349/150 |
| 2010/0188422 A1* | 7/2010 | Shingai et al. | 345/647 |
| 2012/0293960 A1* | 11/2012 | Takashima et al. | 361/707 |
| 2013/0114193 A1* | 5/2013 | Joo et al. | 361/679.01 |
| 2013/0155032 A1 | 6/2013 | Kim | |
| 2013/0222349 A1* | 8/2013 | Baek et al. | 345/204 |
| 2013/0307879 A1* | 11/2013 | Park | 345/690 |

FOREIGN PATENT DOCUMENTS

| | | |
|---|---|---|
| JP | 2005-117224 | 4/2005 |
| KR | 1020030035673 | 5/2003 |
| KR | 10-2013-0071143 | 6/2013 |

OTHER PUBLICATIONS

English Translation of Hwang KR1020030035673; Sep. 5, 2003.*

* cited by examiner

*Primary Examiner* — Anh Mai
*Assistant Examiner* — Glenn Zimmerman
(74) *Attorney, Agent, or Firm* — Innovation Counsel LLP

(57) ABSTRACT

A display device display device includes a display panel, a thermal diffusion prevention layer disposed on the display panel, a first expansion layer and a second expansion layer disposed on the first thermal diffusion prevention layer, and a heating wire layer disposed on at least one of the first expansion layer and the second expansion layer.

19 Claims, 16 Drawing Sheets

DISPLAY DEVICE

CROSS-REFERENCE TO RELATED APPLICATION

This application claims priority to and the benefit of Korean Patent Application No. 10-2013-0059796 filed in the Korean Intellectual Property Office on May 27, 2013, the entire contents of which are incorporated herein by reference.

BACKGROUND (a) Field of the Invention

The present disclosure relates to a display device, and more particularly, to a flexible display device.

(b) Description of the Related Art

Flat panel display is widely used for TV, monitor and hand-held devices.

In the recent years, there has been a growing interest from consumer electronics manufacturers to apply this technology in e-readers, cellular phones and other consumer electronics.

However, since a panel bending direction and bending degree are fixed, the bending direction and bending degree cannot be adjusted to suit individual users.

Furthermore, the display panel may be easily damaged if a force is applied to the display panel in a direction opposite to the panel bending direction.

The above information disclosed in this Background section is only for enhancement of understanding of the background of the invention and therefore it may contain information that does not form the prior art that is already known in this country to a person of ordinary skill in the art.

SUMMARY

Embodiments of the present invention have been made in an effort to provide a display panel and a portable terminal including the display panel having adjustable bending degree controller. The user can easily change the bending degree using the adjustable bending degree controller.

An exemplary embodiment provides a display device comprising: a display panel; a thermal diffusion prevention layer disposed on the display panel; a first expansion layer and a second expansion layer disposed on the first thermal diffusion prevention layer; and a heating wire layer disposed on at least one of the first expansion layer and the second expansion layer.

The heating wire layer may include a lower film, a heating wire disposed on the lower film and an upper film disposed on the heating wire.

The heating wire may be arranged in a zigzag form such that a distance between neighboring heating wire parts is uniform.

The first expansion layer and the second expansion layer may be formed of metals.

The first expansion layer and the second expansion layer may have a linear thermal expansion coefficient difference of greater than $0.5(10^{-6} \cdot K^{-1})$ at 20° C.

The metals may be one of Al, Sb, Pb, Cr, Fe, Ag, Cu, Mn, Mo, Ni, Au, W, Zn, Sn and Pt.

The first expansion layer and the second expansion layer may include sealed spaces containing air.

The first expansion layer or the second expansion layer may include a plurality of small sealed spaces.

A width of the plurality of small spaces may gradually increase or decrease from a center of the display panel toward an edge of the display panel. The display panel may include a flexible substrate made of at least one of polyethersulfone (PES), polyacrylate (PAR), polyetherimide (PEI), polyethylene naphthalate (PEN), polyethylene terephthalate (PET), polyphenylene sulfide (PPS), polyacrylate, polyimide, polycarbonate (PC), cellulose triacetate (TAC) and cellulose acetate propionate (CAP).

The display panel may include an organic light-emitting element disposed on the flexible substrate.

According to an exemplary embodiment of the present invention, the display panel can be easily bent by expanding a metal or inflating air using the heating wire layer.

Therefore, a cellular phone including a display panel bent in various forms can be provided.

DETAILED DESCRIPTION OF THE EMBODIMENTS

Figure 1:
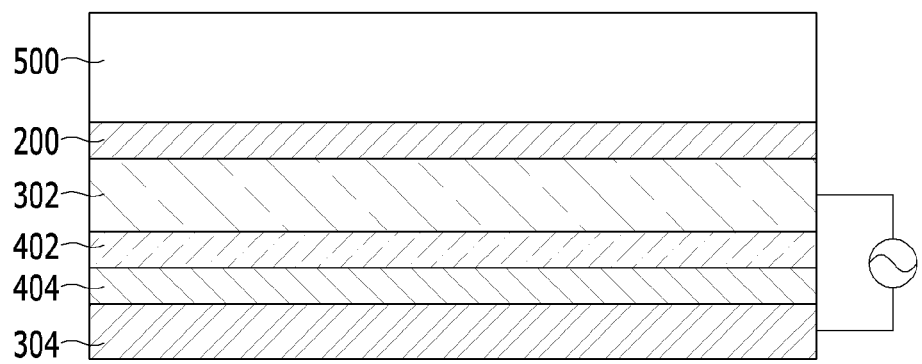
FIG. 1 is a cross-sectional view of a display device according to an exemplary embodiment.

Embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope of the inventive concept.

The drawings and description are to be regarded as illustrative in nature and not restrictive. Like reference numerals designate like elements throughout the specification.

In the drawings, dimensions and thicknesses of components are exaggerated, omitted or schematically illustrated for clarity and convenience of description. In addition, dimensions of constituent elements do not entirely reflect actual dimensions thereof.

In the drawings, the thickness of layers, films, panels, regions, etc., are exaggerated for clarity. In addition, thicknesses of some layers and areas are exaggerated for better understanding and ease of description. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising", will be understood to imply the inclusion of stated elements but not the exclusion of any other elements.

Furthermore, the expression "on" or "under" may be used herein to represent the relationship of one element to another element as illustrated in the figures. It will be understood that this expression is intended to encompass different orientations of the elements in addition to the orientation depicted in the figures, namely, to encompass both "on" and "under".

A display device according to an exemplary embodiment of the present invention will now be described with reference to the attached drawings.

FIG. 1 is a cross-sectional view of a display device according to an exemplary embodiment.

As shown in FIG. 1, a display device 1001 according to an exemplary embodiment includes a display panel 500, a thermal diffusion prevention layer 200, a first heating wire layer 302, a first metal layer 402, a second metal layer 404 and a second heating wire layer 304, which are sequentially disposed on the display panel 500.

The display panel 500 is a flexible display panel and includes a barrier disposed on a flexible substrate, a display part disposed on the barrier, and a sealing member covering and sealing the display part.

The flexible substrate may be an insulating organic material such as polyethersulfone (PES), polyacrylate (PAR), polyetherimide (PEI), polyethylen naphthalate (PEN), polyethylene terephthalate (PET), polyphenylene sulfide (PPS), polyacrylate, polyimide, polycarbonate (PC), cellulose triacetate (TAC) and cellulose acetate propionate (CAP).

The barrier may be formed as a single layer or multiple layers including at least one of an inorganic layer and an organic layer. The barrier prevents an unnecessary component such as moisture from passing through the flexible substrate and infiltrating into the display part.

The display part displays an image corresponding to a video signal and may include a display element (not shown) such as an OLED and LCD.

The display part will now be described in detail with reference to FIG. 2.

Figure 2:
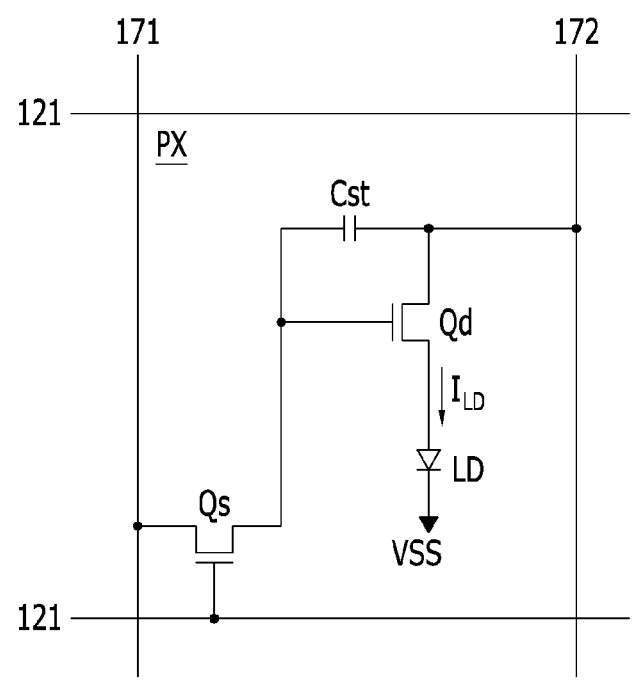
FIG. 2 is an equivalent circuit diagram of a pixel of an OLED display according to an exemplary embodiment.

FIG. 2 is an equivalent circuit diagram of a pixel of an OLED display according to an exemplary embodiment.

Referring to FIG. 2, the OLED display according to the present exemplary embodiment includes a plurality of signal lines 121, 171 and 172 and a pixel PX connected to the signal lines 121, 171 and 172.

The signal lines include scan signal lines 121 transferring a gate signal (or scan signal), data lines 171 transferring a data signal, and driving voltage lines 172 transferring a driving voltage. The gate lines 121 extend substantially parallel to the row direction and the data lines 171 extend substantially parallel to the column direction. While FIG. 2 shows that the driving voltage lines 172 extend in the approximately column direction, the driving voltage lines 172 may be arranged in the column direction, row direction or in a matrix form.

The pixel PX includes a switching transistor Qs, a driving transistor Qd, a storage capacitor Cst and an organic light-emitting element LD.

The switching transistor Qs has a control terminal, an input terminal and an output terminal. The control terminal is connected to the corresponding gate line 121, the input terminal is connected to the corresponding data line 171 and the output terminal is connected to a control terminal of the driving transistor Qd. The switching transistor Qs delivers a data signal received from the data line 171 to the control terminal of the driving transistor Qd in response to a scan signal received from the gate line 121.

The driving transistor Qd also has a control terminal, an input terminal and an output terminal. The control terminal is connected to the output terminal of the switching transistor Qs, the input terminal is connected to the corresponding driving voltage line 172 and the output terminal is connected to the anode of the organic light-emitting element LD. The driving transistor Qd outputs an output current ILD varying with a voltage applied across the control terminal and the output terminal thereof.

The storage capacitor Cst is connected between the control terminal and the input terminal of the driving transistor Qd. The storage capacitor Cst charges a data signal applied to the control terminal of the driving transistor Qd and maintains the data signal even after the switching transistor Qs is turned off.

The organic light-emitting element LD is an OLED, for example, and includes an anode connected to the output terminal of the driving transistor Qd and a cathode connected to a common voltage source Vss. The organic light-emitting element LD emits light having intensity varying according to the output current ILD of the driving transistor Qd to display an image. The organic light-emitting element LD may contain an organic material that uniquely emits one or more primary colors of red, green and blue. The OLED display displays a desired image according to the spatial sum of these colors.

While the switching transistor Qs and the driving transistor Qd are illustrated as being n-channel field effect transistors (FETs), at least one thereof may be a p-channel FET. The connection relation among the switching transistor Qs, the driving transistor Qd, the storage capacitor Cst and the organic light-emitting element LD may be changed.

Figure 3:
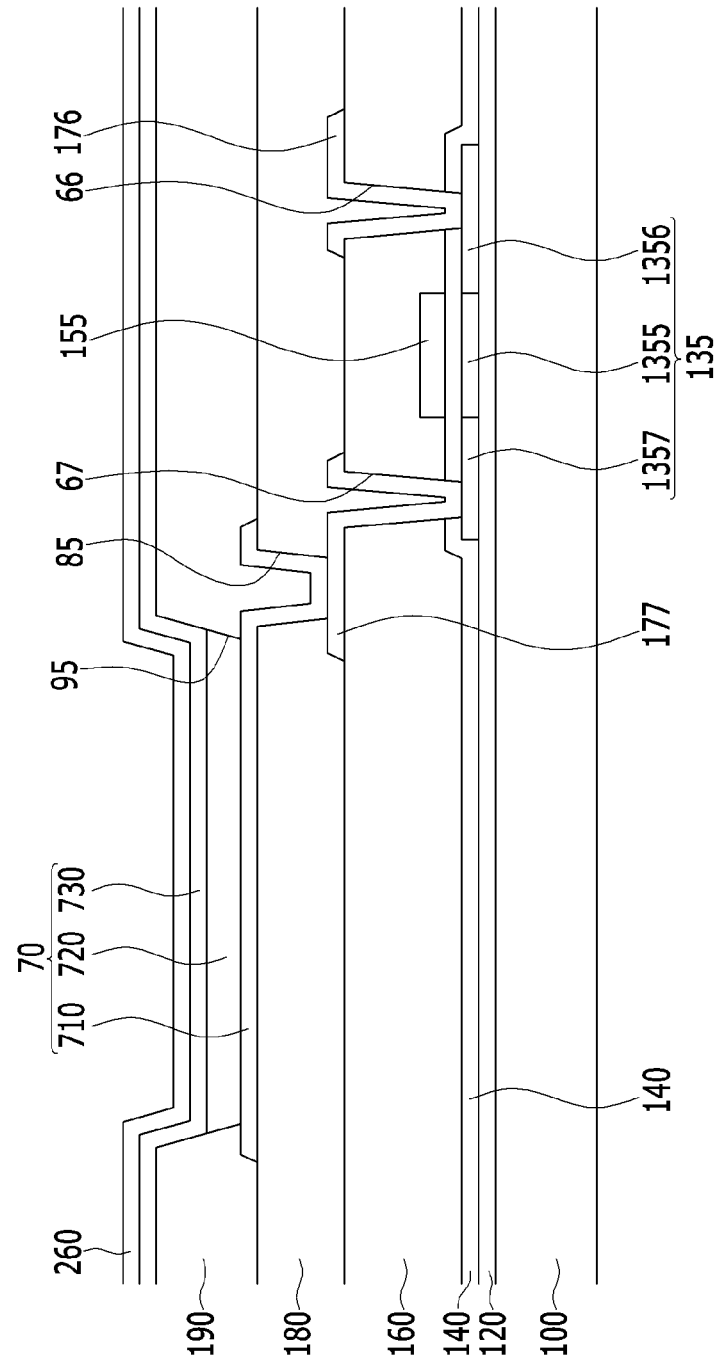
FIG. 3 is a cross-sectional view of a pixel of an OLED display according to an exemplary embodiment.

FIG. 3 is a cross-sectional view of the pixel of the OLED display according to an exemplary embodiment.

FIG. 3 illustrates the pixel focusing on the driving thin film transistor Qd and organic light-emitting element 70 of FIG. 2. In the following description, the driving thin film transistor Qd is simply called a thin film transistor.

As shown in FIG. 3, the OLED display includes a substrate 100 and a buffer layer 120 formed on the substrate 100.

The substrate 100 may be a transparent insulating substrate made of glass, quartz, ceramic or plastic. The substrate 100 may be a metal substrate made of stainless steel.

The buffer layer 120 may be formed of a single SiNx layer or a double layer of SiNx and $SiO_2$. The buffer layer 120 prevents unnecessary components such as impurities or moisture from infiltrating into the substrate 100 and planarizes the surface of the substrate 100.

A semiconductor layer 135 is formed of polysilicon on the buffer layer 120.

The semiconductor layer 135 comprises a channel region 1355, a source region 1356 and a drain region 1357 respectively formed on both sides of the channel region 1355. The channel region 1355 of the semiconductor layer 135 is made of undoped polysilicon, that is, an intrinsic semiconductor. The source region 1356 and the drain region 1357 are made of polysilicon doped with a conductive impurity, that is, an impurity semiconductor. The impurity doped into the source region 1356 and the drain region 1357 may be a p-type impurity or an n-type impurity.

A gate insulating layer 140 is formed on the semiconductor layer 135. The gate insulating layer 140 may be a single layer or multi-layer including at least one of tetraethylorthosilicate (TEOS), silicon nitride and silicon oxide.

A gate electrode 155 is formed on the semiconductor layer 135 and disposed on the channel region 1355.

The gate electrode 155 may be formed of a single layer or multiple layers of a low resistance material such as Al, Ti, Mo, Cu, Ni and alloys thereof.

A first interlayer insulating layer 160 is formed on the gate electrode 155. The first interlayer insulating layer 160 may be formed of a single layer or multiple layers including at least one of tetraethylorthosilicate (TEOS), silicon nitride and silicon oxide, like the gate insulating layer 140.

The first interlayer insulating layer 160 and the gate insulating layer 140 have a source contact hole 66 and a drain contact hole 67 which respectively expose the source region 1356 and the drain region 1357.

A source electrode 176 and a drain electrode 177 are formed on the first interlayer insulating layer 160. The source electrode 176 is connected to the source region 1356 through the source contact hole 66 and the drain electrode 177 is connected to the drain region 1357 through the drain contact hole 67.

The source electrode 176 and drain electrode 177 may be a single layer or multiple layers of a low resistance material such as Al, Ti, Mo, Cu, Ni and alloys thereof. For example, the source electrode 176 and drain electrode 177 can be formed of a three-level layer of Ti/Cu/Ti, Ti/Ag/Ti or Mo/Al/Mo.

The gate electrode 155, the source electrode 176 and the drain electrode 177 respectively correspond to the control terminal, the input terminal and the output terminal of the driving transistor Qd shown in FIG. 2. The gate electrode 155, the source electrode 176 and the drain electrode 177 form the thin film transistor along with the semiconductor layer 135. A channel of the thin film transistor is formed on the portion of the semiconductor layer 135, which is disposed between the source electrode 176 and the drain electrode 177.

A second interlayer insulating layer 180 is formed on the source electrode 176 and the drain electrode 177. The second interlayer insulating layer 180 includes a contact hole 85 exposing the drain electrode 177.

The second interlayer insulating layer 180 may be formed of a single layer or multiple layers of at least one of tetraethylorthosilicate (TEOS), silicon nitride and silicon oxide or may be formed of a low dielectric constant organic material.

A first electrode 710 is formed on the second interlayer insulating layer 180. The first electrode 710 is electrically connected to the drain electrode 177 through the contact hole 85 and may be the anode of the organic light-emitting element of FIG. 2.

While the interlayer insulating layer is formed between the first electrode 710 and the drain electrode 177 in the present exemplary embodiment of the invention, the first electrode 710 can be formed at the same level as the drain electrode 177 and may be integrated with the drain electrode 177.

A pixel definition layer 190 is formed on the first electrode 710.

The pixel definition layer 190 has an opening 95 exposing the first electrode 710. The pixel definition layer 190 may be formed of a resin such as a polyacrylate or polyimide and an inorganic material such as silica.

An organic emission layer 720 is formed in the opening 95 of the pixel definition layer 190.

The organic emission layer 720 is formed of multiple layers including one or more of an emission layer, a hole injection layer (HIL), a hole transport layer (HTL), an electron transport layer (ETL) and an electron injection layer (EIL).

When the organic emission layer 720 includes all the layers, the hole injection layer may be disposed on the first electrode 710 corresponding to the anode and the hole transport layer, emission layer, electron transport layer and electron injection layer may be sequentially laminated on the hole injection layer.

A second electrode 730 is formed on the pixel definition layer 190 and the organic emission layer 720.

The second electrode 730 corresponds to the cathode of the organic light-emitting element. Accordingly, the first electrode 710, the organic emission layer 720 and the second electrode 730 form the organic light-emitting element LD 70.

The OLED display can be of one of front display type, rear display type and dual-sided display type according to the direction in which the organic light-emitting element 70 emits light.

In the case of the front display type, the first electrode 710 is formed of a reflective layer and the second electrode 730 is formed of a transflective or transmissive layer. In the case of the rear display type, the first electrode 710 is formed of a transflective layer and the second electrode 730 is formed of a reflective layer. In the case of dual-sided display type, the first electrode 710 and the second electrode 730 are formed of a transmissive or transflective layer.

A reflective layer and a transflective layer are made of at least one of Mg, Ag, Au, Ca, Li, Cr and Al or an alloy thereof. The reflective layer and the transflective layer are determined by the thicknesses thereof and the transflective layer may have a thickness of less than 200 nm. While the transmittance of the reflective layer or transflective layer increases as the thickness thereof decreases, the resistance thereof increases as the thickness thereof decreases.

The transmissive layer is made of indium tin oxide (ITO), indium zinc oxide (IZO), ZnO or indium oxide ($In_2O_3$).

Referring back to FIG. 1, the thermal diffusion prevention layer 200 prevents heat generated in the first heating wire layer 302 from being transferred to the display panel 500. The thermal diffusion prevention layer 200 prevents the heat transfer from the first heating wire layer 302 to the display panel 500. Or the thermal diffusion prevention layer 200 diffuses the heat quickly. For example the thermal diffusion prevention layer 200 may be formed of Cu or Al to diffuse the heat quickly.

The first heating wire layer 302 generates heat to heat the first metal layer 402 and is bent in various forms according to arrangement of a heating wire. Accordingly, a bending form of the heating wire layer can be controlled by changing arrangement of the heating wire.

The first metal layer 402 and the second metal layer 404 may be formed of metals having a big thermal expansion coefficient difference, for example, the thermal expansion coefficient difference of greater than 0.5. For example, the first metal layer 402 and the second metal layer 404 can be formed of Cu and Fe, Al and Fe or Al and Cu.

The first metal layer 402 and the second metal layer 404 may be made of at least one of Al 2.38, Sb 1.09, Pb 2.93, Cr 0.84, Fe 1.2, Au 1.43, Cu 1.71, Mn 2.28, Mo 0.52, Ni 1.30, Ag 1.97, W 0.45, Zn 2.97, Sn 2.70, and Pt 0.90. Here, the value represents a thermal expansion coefficient of the respective metal.

A display panel can be easily bent by forming a metal layer and a heating wire layer as described above.

This will be described in detail with reference to FIGS. 4 and 5.

Figure 4:
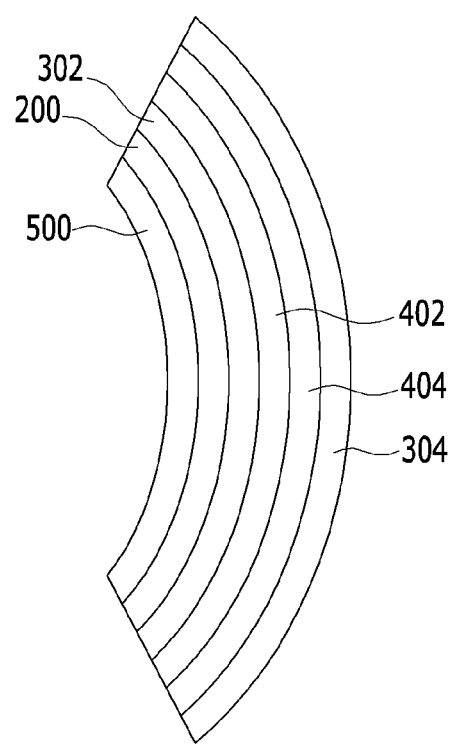
FIGS. 4 and 5 are cross-sectional views illustrating bending of a display panel according to an exemplary embodiment.
Figure 5:
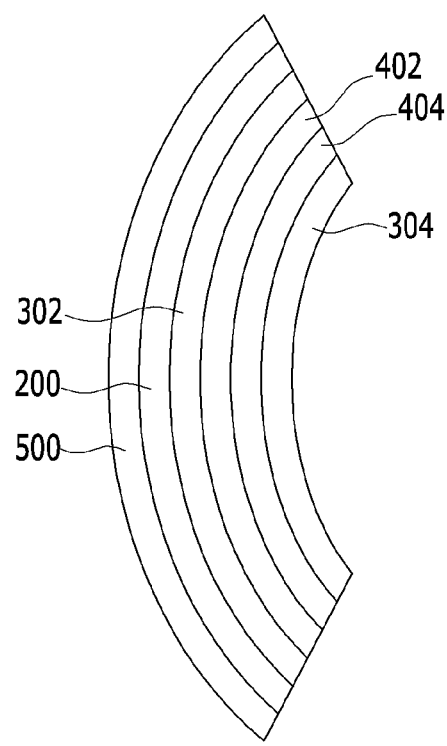

FIGS. 4 and 5 are cross-sectional views for illustrating bending of a display panel according to an exemplary embodiment.

As shown in FIG. 4, when power is applied to the second heating wire layer 304, the second heating wire layer 304 heats the second metal layer 404 and thus the second metal layer 404 is expanded.

Accordingly, while the temperature of the second metal layer 404 in contact with the second heating wire layer 304 increases, the temperature of the first metal layer 402 spaced apart from the second heating wire layer 304 is relatively low. Therefore, the first metal layer 402 expands less than the second metal layer 404 and thus the display device 1001 is bent in such a manner that the side corresponding to the first metal layer 402 becomes concave.

That is, as shown in FIG. 4, upon expansion of the second metal layer 404, the display device 1001 is bent to have concave side in the first metal side because the first metal layer 402 does not expand compared to the second metal.

Here, since a bending degree of the display device 1001 depends on thermal expansion of the first metal layer 402 and the second metal layer 404, the display device 1001 can be easily bent at a low temperature by using the first metal layer 402 and the second metal layer 404 having high coefficients of thermal expansion.

Referring to FIG. 5, when power is applied to the first heating wire layer 302, the first heating wire layer 302 heats the first metal layer 402 and thus the first metal layer 402 expands more than the second metal layer 404.

While the temperature of the first metal layer 402 in contact with the first heating wire layer 302 increases, the temperature of the second metal layer spaced apart from the first heating wire layer 302 becomes relatively low compared to the first heating layer. Accordingly, the second metal layer 404 expands less than the first metal layer 402 and thus the display device 1001 is bent in such a manner that the side corresponding to the second metal layer 404 becomes concave.

In this manner, it is possible to change a bending direction of the display 1001 by applying power to the first heating wire layer 302 or the second heating wire layer 304 to expand the first metal layer 402 or the second metal layer 404.

A bending degree and a bending shape of the display panel can be changed by varying arrangement of a heating wire contained in a heating wire layer.

This will be described in detail with reference to FIGS. 6 to 10.

FIGS. 6 to 10 are top plan views of heating wire layers according to exemplary embodiments.

Figure 6:
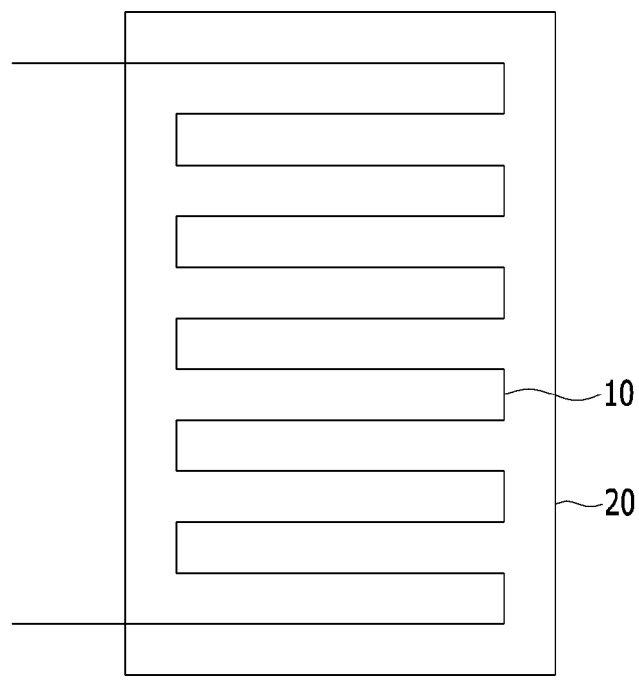
FIGS. 6 to 10 are top plan views of a heating wire layer according to different exemplary embodiments.

Referring to FIG. 6, the heating wire layer includes a heating wire 10 and a protection film 20 disposed on the top and bottom of the heating wire 10 to protect the heating wire 10.

The heating wire 10 is arranged in a predetermined pattern. When the heating wire 10 is arranged in the predetermined pattern in this manner, the first or second metal layer uniformly expand and thus the display panel is gently bent to have a curvature, as shown in FIG. 4 or 5. The radius of curvature (R) of the curved display panel may be changed according to arrangement of the heating wire. The display panel is bent more when the heating wire is arranged in such a manner that the distance between neighboring heating wire parts becomes narrower and less bent when the heating wire is arranged in such a manner that the distance between neighboring heating wire parts becomes wider.

As shown in FIGS. 7 to 10, the heating wire may be disposed on parts of the substrate such that the display panel can be bent in various manners having various curvatures by adjusting the distance between neighboring heating wire parts of the heating wire.

Figure 7:
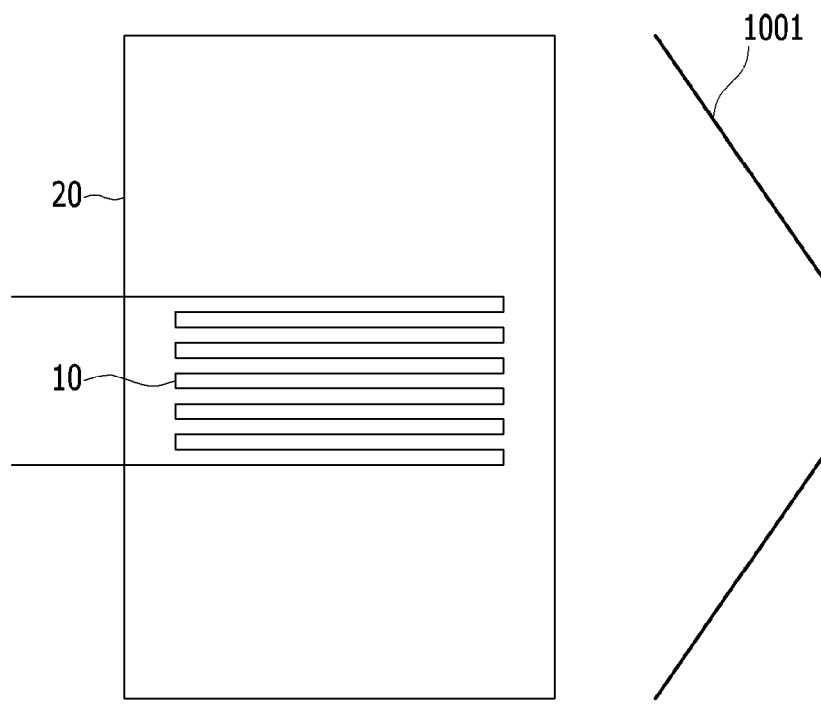

Specifically, when the heating wire is disposed only at the center of the substrate, as shown in FIG. 7, the metal layer corresponding to the center of the substrate expand and thus only the center of the display device 1001 is bent.

Figure 8:
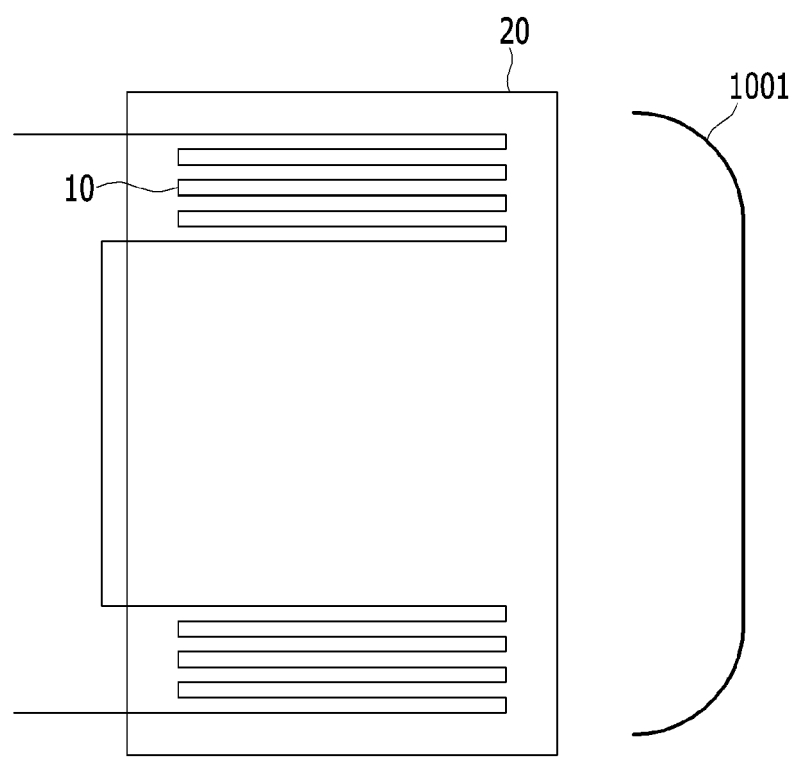
Figure 9:
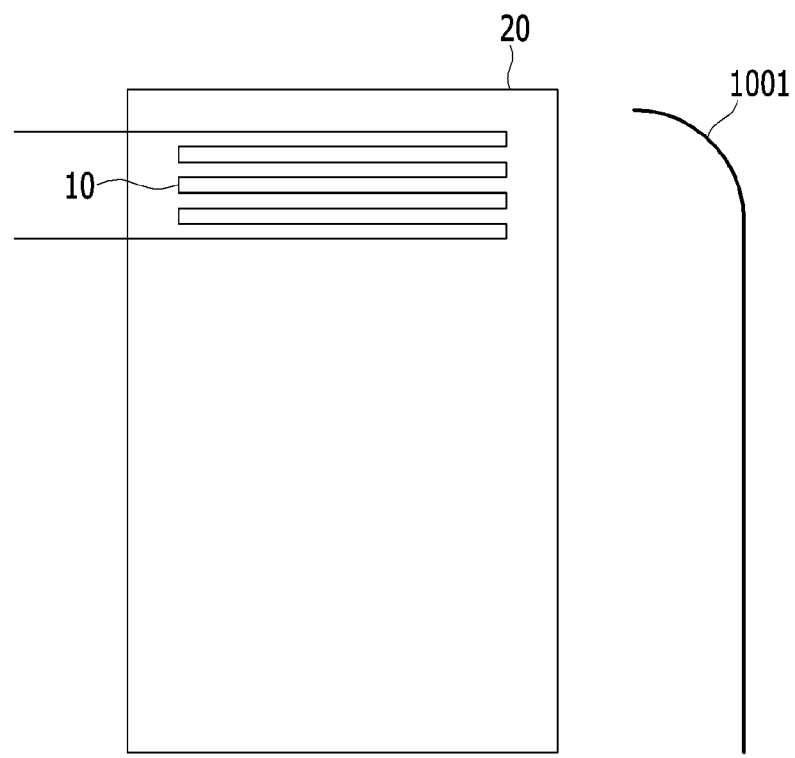
Figure 10:
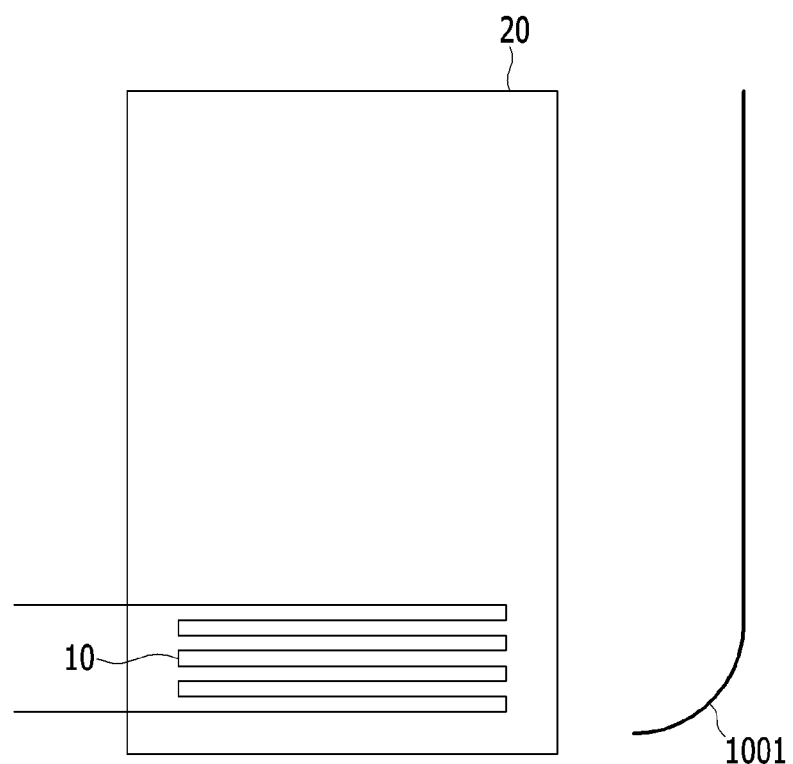

When the heating wire is disposed on at least one of edges of the substrate as shown in FIGS. 8, 9 and 10, one or both edges of the substrate is bent while the center there of is flat.

An operation of a cellular phone including the above-described display panel will now be described with reference to FIG. 11.

Figure 11:
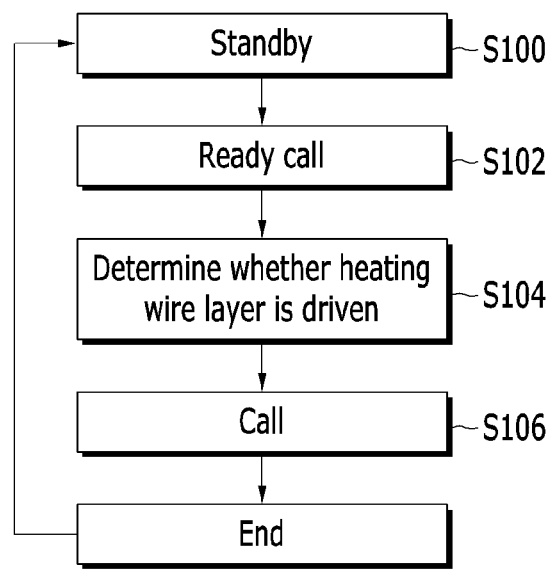
FIG. 11 is a flowchart illustrating operation of a cellular phone including a display panel according to an exemplary embodiment.

FIG. 11 is a flowchart illustrating an operation of a cellular phone including the display panel according to an exemplary embodiment.

Referring to FIG. 11, the cellular phone is in a standby state (S100). The cellular phone may enter a call ready state to make a call or to receive a call according to user instruction (S102).

The call ready state S102 is a state in which a user dials the number of the other party to call the other party or the phone rings.

When the cellular phone is in the call ready state S102, power is applied to a heating wire layer included in the display panel (S104). Then, the first metal layer or the second metal layer expand and is bent, as shown in FIG. 4 or 5. Accordingly, the display panel is being bent while the user maintains a call state (S106).

Here, the cellular phone including the display panel is bent in a direction in which the center of the cellular phone is separated from the body of the user such that a predetermined distance between the body of the user and the cellular phone is maintained.

When the cellular phone is bent during a call as described above, the body of the user does not come into contact with the cellular phone. When the body of the user comes into contact with the cellular phone, user sweat or sebum is attached to the surface of the cellular phone, contaminating the surface of the cellular phone. However, when the cellular phone is bent during a call, as described above, the body of the user does not come into contact with the cellular phone and thus the surface of the cellular phone can be prevented from contamination.

Upon completion of the call state, the cellular phone returns to the standby state (S100) and power is not applied to the heating wire layer. Accordingly, the expanded first metal layer 402 or second metal layer 404 is restored to its original size and thus the cellular phone becomes unbent state and becomes flat in the standby state.

The present invention can prevent the cellular phone from being damaged even when impact is applied thereto by bending the cellular phone depending on whether the cellular phone is in a call state or not. Furthermore, the cellular phone can be prevented from being contaminated because the cellular phone does not come into contact with the body of the user.

Figure 12:
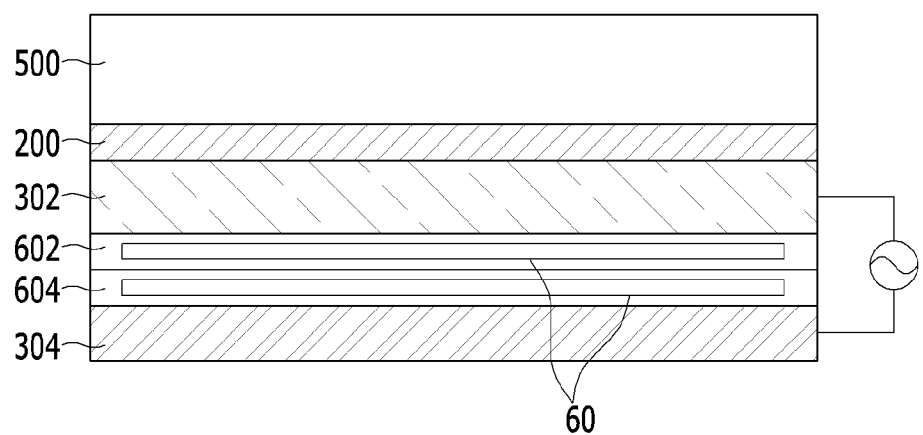
FIG. 12 is a cross-sectional view of a display device according to another exemplary embodiment.

FIG. 12 is a cross-sectional view of a display device 1002 according to another exemplary embodiment.

Since the display device illustrated in FIG. 12 is similar to the display device illustrated in FIG. 1, only different parts are described in detail.

Referring to FIG. 12, the display device 1002 includes the display panel 500, the thermal diffusion prevention layer 200, the first heating wire layer 302, a first air layer 602, a second air layer 604 and the second heating wire layer 304, which are sequentially disposed on the display panel 500.

The display panel 1002 shown in FIG. 12 includes the first air layer 602 and the second air layer 604 having sealed spaces 60 instead of the first metal layer 402 and the second metal layer 404 of FIG. 1.

Referring to FIG. 12, air is filled in the sealed spaces 60. Air increases in volume as temperature increases if pressure applied to the air is uniform. That is, the volume of air increases by $\frac{1}{273}$ as temperature increases 1° C. when pressure applied thereto is uniform according to Charles' law.

Accordingly, when power is applied to the first heating wire layer 302, the sealed space 60 of the first air layer 602 expands and thus the display device 1002 is bent toward the second air layer 604 (refer to FIG. 5). When power is applied to the second heating wire layer 304, the sealed space 60 of the second air layer 604 expands and thus the display device 1002 is bent toward the first air layer 602 (refer to FIG. 4).

Each of the first air layer 602 and the second air layer 604 may have one sealed space 60 such that the display device can be gently bent in a predetermined curvature, as shown in FIGS. 4 and 5.

Figure 13:
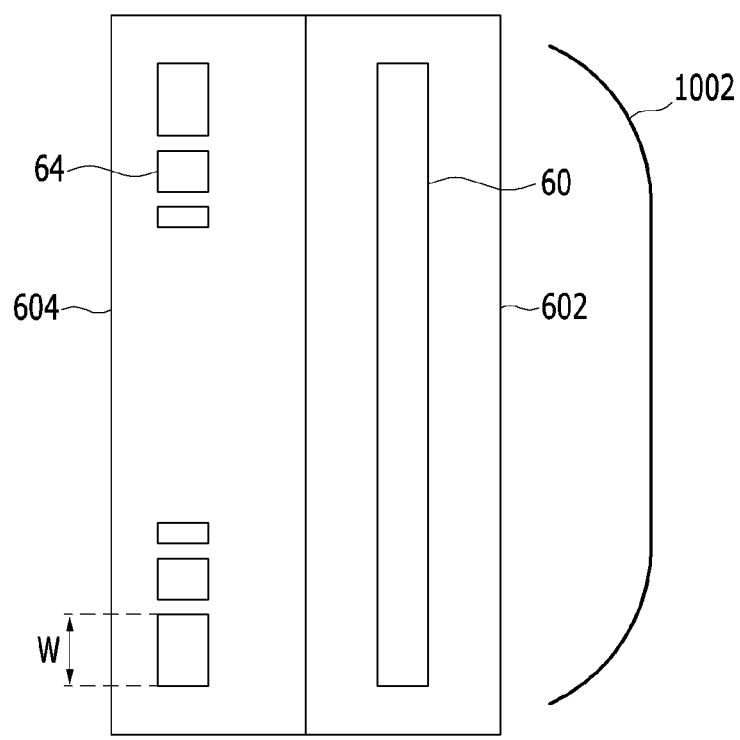
FIGS. 13 and 14 are cross-sectional views of air layers according to different exemplary embodiment.
Figure 14:
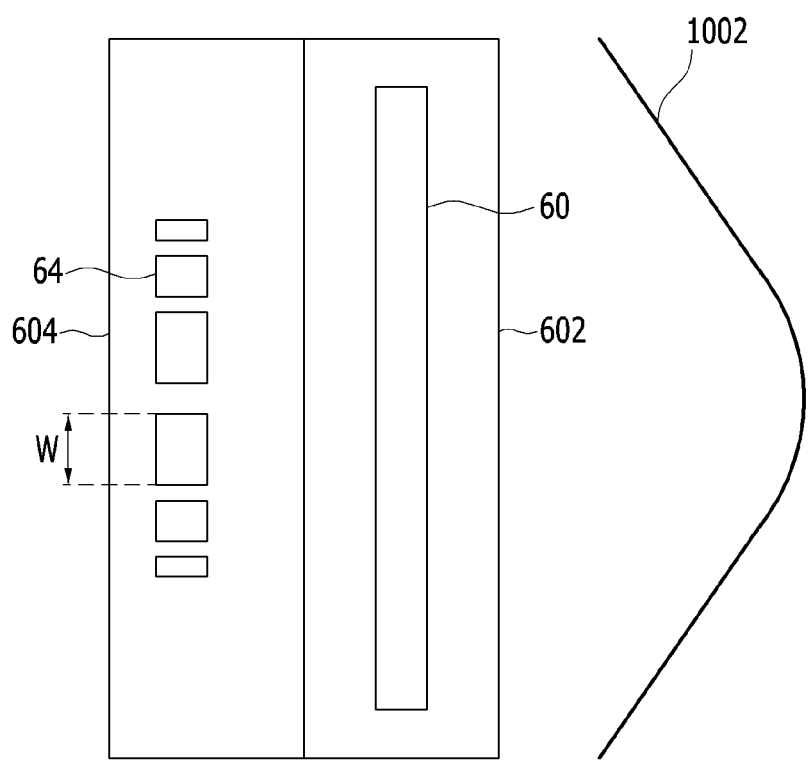

In addition, the first air layer 602 and the second air layer 604 may include a plurality of small spaces 64, as shown in FIGS. 13 and 14.

FIGS. 13 and 14 are cross-sectional views of air layers according to other exemplary embodiments.

Referring to FIGS. 13 and 14, the first air layer 602 has a sealed space, whereas the second air layer 604 has multiple small spaces 64.

When the display device 1002 needs to be bent by the same degree in the direction of the first air layer and in the direction of the second air layer, the first and the second air layers may have same configuration, as shown in FIG. 12.

However, when the display device 1002 needs to be bent in a specific direction, since the display device 1002 is used in a cellular phone, the first air layer 602 may include a single space and the second air layer 604 may include multiple small spaces 64, as shown in FIGS. 13 and 14, such that the display device 1002 can be easily bent.

In FIG. 13, the small spaces 64 are formed only at the edge of the second air layer 604 such that the edge of the display panel is bent when power is applied thereto. In FIG. 14, the small spaces 64 are formed only at the center of the second air layer 604 such that the center of the display panel is bent easily.

Here, the small spaces 64 may be formed in such a manner that widths W of small spaces disposed at the center are narrower than small spaces disposed at the edge, as shown in FIG. 13, or small spaces disposed at the center are wider than small spaces disposed at the edge, as shown in FIG. 14. While the small spaces may be formed at uniform intervals, the present invention is not limited thereto. That is, a width of the small spaces can gradually increase or decrease from a center of the display panel toward an edge of the display panel.

Accordingly, it is possible to easily control a bending form of the display panel by adjusting widths and intervals of the small spaces.

Figure 15:
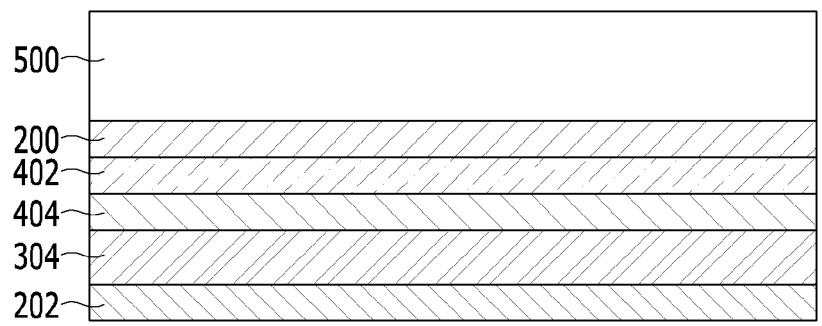
FIGS. 15 and 16 are cross-sectional views of display devices according to different exemplary embodiments.
Figure 16:
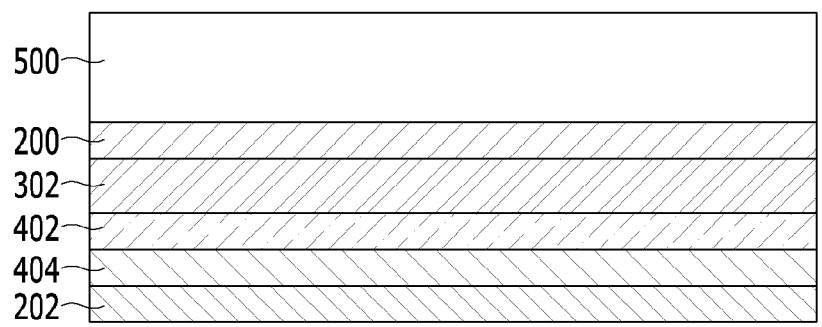

FIGS. 15 and 16 are cross-sectional views of display devices according to other exemplary embodiments.

Since layer components of the display devices shown in FIGS. 15 and 16 are similar to those of the display device shown in FIG. 1, only different parts will now be described in detail.

A display device 1003 shown in FIG. 15 further includes a thermal diffusion prevention layer 202 disposed on the second heating wire layer 304. A display device of FIG. 16 further includes the thermal diffusion prevention layer 202 disposed on the second metal layer 404 without having the second heating wire layer.

In this manner, the thermal diffusion prevention layer and the heating wire layer may be added or omitted according to a bending form and heating temperature.

In the display device including the air layer as shown in FIGS. 12, 13 and 14, the layers may be laminated in a different order as shown in FIGS. 15 and 16.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
a display panel;
a thermal diffusion prevention layer disposed on the display panel;
a first expansion layer and a second expansion layer disposed on the first thermal diffusion prevention layer; and
a heating wire layer disposed on at least one of the first expansion layer and the second expansion layer,
wherein the display panel on a region corresponding to the heating wire layer is configured to be bent according to a difference in an amount of lateral expansion of the first expansion layer and the second expansion layer.

2. The display device of claim 1, wherein the heating wire layer includes a lower film, a heating wire disposed on the lower film and an upper film disposed on the heating wire.

3. The display device of claim 2, wherein the heating wire is arranged in a zigzag form such that a distance between neighboring heating wire parts is uniform.

4. The display device of claim 1, wherein the first expansion layer and the second expansion layer are formed of metals.

5. The display device of claim 4, wherein the first expansion layer and the second expansion layer have a thermal expansion coefficient difference of greater than $0.5(10^{-6} \cdot K^{-1})$ at 20° C.

6. The display device of claim 5, wherein the metals are one of Al, Sb, Pb, Cr, Fe, Ag, Cu, Mn, Mo, Ni, Au, W, Zn, Sn and Pt.

7. The display device of claim 1, wherein the first expansion layer and the second expansion layer include sealed spaces containing air.

8. The display device of claim 7, wherein the first expansion layer or the second expansion layer includes a plurality of small sealed spaces.

9. The display device of claim 8, wherein a width of the small spaces gradually increases or decreases from a center of the display panel toward an edge of the display panel.

10. The display device of claim 1, wherein the display panel includes a flexible substrate made of at least one of polyethersulfone (PES), polyacrylate (PAR), polyetherimide (PEI), polyethylene naphthalate (PEN), polyethylene terephthalate (PET), polyphenylene sulfide (PPS), polyacrylate, polyimide, polycarbonate (PC), cellulose triacetate (TAC) and cellulose acetate propionate (CAP).

11. The display device of claim 10, wherein the display panel includes an organic light-emitting element disposed on the flexible substrate.

12. The display device of claim 2, wherein the heating wire layer includes a first heating wire layer having a first heating wire and a second heating wire layer having a second heating wire, the first heating wire and the second heating wire being disposed on the first expansion layer and the second expansion layer, respectively.

13. The display device of claim 12, wherein power to the first heating wire layer and the second heating wire layer is controlled independently.

14. The display device of claim 13, wherein the power to the first heating wire layer and the second heating wire layer control a bending direction of the display panel.

15. The display device of claim 14, wherein the first heating wire and the second heating wire is arranged in a zigzag form such that a distance between neighboring heating wire parts is uniform.

16. The display device of claim 15, wherein the first heating wire is disposed on a lower film substantially throughout the heating wire layer.

17. The display device of claim 15, wherein the first heating wire is disposed on a lower film only at the center of the heating layer.

18. The display device of claim 15, wherein the first heating wire is disposed on a lower film only at an upper edge or a lower edge of the heating layer.

19. The display device of claim 15, wherein the first heating wire is disposed on a lower film at an upper edge or a lower edge of the heating layer.

* * * * *